United States Patent
Florin

(10) Patent No.: US 6,947,620 B2
(45) Date of Patent: Sep. 20, 2005

(54) OPTOELECTRONIC COUPLER

(75) Inventor: Wilhelm Florin, Duisburg (DE)

(73) Assignee: Krohne Messtechnik GmbH & Co. KG, Duisburg (DE)

( * ) Notice: Subject to any disclaimer, the term of this patent is extended or adjusted under 35 U.S.C. 154(b) by 162 days.

(21) Appl. No.: 10/462,550

(22) Filed: Jun. 16, 2003

(65) Prior Publication Data

US 2004/0052497 A1 Mar. 18, 2004

(30) Foreign Application Priority Data

Jun. 25, 2002 (DE) .......................................... 102 28 390

(51) Int. Cl.⁷ .......................... G02B 6/12; G02B 6/122; G02B 6/42
(52) U.S. Cl. .......................... 385/14; 385/146; 385/31; 257/98
(58) Field of Search .......................... 257/80–85, 683, 257/98; 385/88–94, 14, 31, 146

(56) References Cited

U.S. PATENT DOCUMENTS

| | | | | |
|---|---|---|---|---|
| 4,100,422 A | * | 7/1978 | Thillays | 250/551 |
| 4,124,860 A | * | 11/1978 | Johnson | 257/82 |
| 4,367,483 A | * | 1/1983 | Takahashi et al. | 257/80 |
| 5,315,672 A | * | 5/1994 | Padovani | 385/12 |
| 5,978,526 A | * | 11/1999 | Morikuni et al. | 385/14 |

* cited by examiner

Primary Examiner—Rodney Bovernick
Assistant Examiner—Omar Rojas
(74) Attorney, Agent, or Firm—Ceasri and McKenna, LLP; John F. McKenna

(57) ABSTRACT

An optoelectronic coupler includes two photodiodes and an optic light guide, where one of the two photodiodes serves as the transmitting diode and the other as the receiving diode and the light guide serves to guide the light emitted by the transmitting diode to the receiving diode. The transmitting diode and the receiving diode are mounted on a circuit board at a distance from each other and the light guide is constituted of a plastic or glass element mounted on the same circuit board. This arrangement provides for a simple optoelectronic coupler design that permits safe operation even from the perspective of explosion protection.

11 Claims, 1 Drawing Sheet

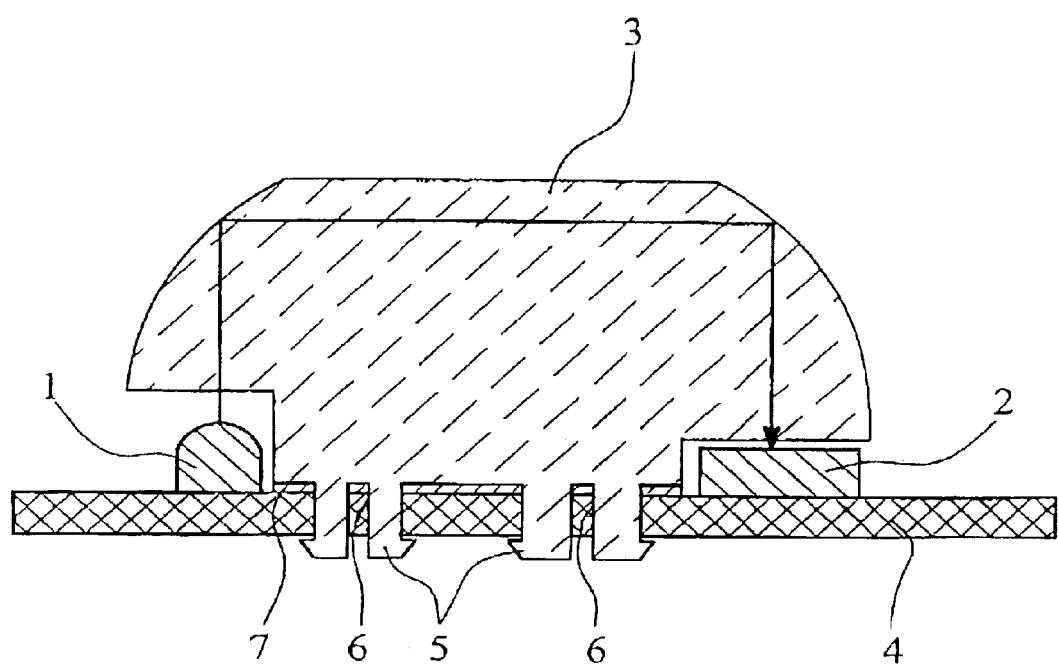

OPTOELECTRONIC COUPLER

BACKGROUND OF THE INVENTION

1. Field of the Invention

This invention relates to an optoelectronic coupler with two photodiodes and an optic light guide, with one of the two photodiodes serving as the transmitting diode and the other as the receiving diode, while the light guide carries the light emitted by the transmitting diode to the receiving diode.

Optoelectronic couplers as described above are frequently used for digital data transmission, especially in cases where, as explained below, explosion-protection regulations require the electroconductive separation of any two electrical circuits.

In various fields of technology, as for instance in flow-rate and fill-level measurements, it is often necessary to protect the equipment employed against explosion hazards. To obtain such explosion protection, functional areas requiring different treatment must be kept separate from one another. Such separation is imperative especially for measuring systems that receive their electric energy via separate AC lines and are usually referred to as four-wire units. As differentiated from these four-wire systems, two-wire systems are those in which the electric power supply and the data transmission share one common line, obviating the need for a separate electric line.

2. Description of the Prior Art

The aforementioned four-wire systems most commonly receive their electric power with "enhanced safety" type of protection. Such "enhanced safety" type of protection involves provisions whereby a higher level of safety precautions prevents inadmissibly high temperatures as well as sparking or arcing on the inside or outside of electrical components where such phenomena are not supposed to occur in normal operation. The type of protection provided on the side of the sensor which in the case of a magneto-inductive flowmeter would be on the side of the electrodes, or in the case of a Coriolis-type mass flowmeter on the side of the driver and the sensor coils, is usually in the form of "inherent safety". For the purpose of "inherent safety" the energy in the circuit is maintained at a level so low that no sparks, arcs or temperatures capable of causing an ignition can be generated. With "inherent safety", even short-circuiting will not produce a spark that could cause an ignition leading to an explosion.

One way to obtain "inherent safety" involves so-called "barrier technology", which essentially employs limiting circuitry toward "safe ground". For measuring purposes, however, such relationship with "safe ground" is susceptible to interference due to ground return loops while also being error-prone because the connection to "safe ground" must generally be provided by the user of the measuring instrument concerned when that is put in operation. It has, therefore, been found safer and therefore desirable to employ conductively separated circuits, obviating the need for "safe ground" limiting provisions.

In the case of four-wire devices, the conductively separated circuits must carry electric power and, respectively, handle typically digital data communication. The electric power is generally supplied via DC/DC converters with safely separating isolation transformers, while digital data communication usually takes place via optoelectronic couplers.

For these optoelectronic couplers, handling the digital data transmission, to be adequately explosion-protected, minimum gap requirements have been established for the so-called air and creepage paths. For example, the distance between the electrically separated circuits must correspond to a 10 mm creepage path or consist of 1 mm solid insulation whenever the maximum allowable voltage is 375 V, i.e. when the power supplied is 230V line voltage. In that case, only certain, specially approved optoelectronic couplers may be used, featuring a minimum of 1 mm solid insulation between the transmitting diode and the receiving diode, provided the insulating layer is guaranteed to withstand the maximum temperature permissible from the safety point of view and provided the aforementioned 10 mm creepage gap on the circuit board carrying the diodes is maintained. This creepage gap of at least 10 mm on the circuit board applies in particular to the pin spacing of the optoelectronic couplers and to the pad spacing on the circuit board.

Yet optoelectronic couplers that meet the aforementioned requirements are relatively expensive, they are predominantly in the form of hard-wired components that involve complex installation, they tend to be bulky because of the necessary spacings referred to above and the additional protective provisions, and given the minimum of 1 mm insulating space, their optical coupling is poor. This is why optoelectronic couplers of this type most often fail to achieve rapid data transmission.

SUMMARY OF THE INVENTION

It is therefore an objective of this invention to introduce an optoelectronic coupler that is low-priced, simple in design and easy to install while still meeting the explosion protection requirements.

For the optoelectronic coupler described above, this objective is achieved in that the transmitting diode and the receiving diode are mounted at a distance from each other on a circuit board and a light guide in the form of a plastic or glass element is likewise mounted on the circuit board.

The light guide in the form of a plastic or glass element guides the light emanating from the transmitting diode to the receiving diode, employing the principle of total reflection, meaning that the transmitting diode and the receiving diode can, in essence, be positioned in any desired location. As in conventional optoelectronic couplers, the light-radiating surface of the transmitting diode may be directed toward the light-receiving surface of the receiving diode, i.e. the transmitting diode and the receiving diode may face each other. However, according to a preferred embodiment of the invention, the light-radiating surface of the transmitting diode and the light-receiving surface of the receiving diode point away from the circuit board, preferably upward from the circuit board in a mutually parallel direction. Thus, employing a surface-mounting process, the photodiodes are simply set on top of the circuit board without requiring any complex aligning of the photodiodes with each other.

The light guide may consist of essentially any traditional glass or synthetic material. Of course, for use in an area susceptible to explosion, the material of the light guide must be noncombustible or at least highly nonflammable and, in any event, thermally stable. In a preferred implementation of the invention the light guide is made of polycarbonate. It has also been found particularly effective to produce the light guide by injection molding.

The light guide in the form of a plastic or glass element thus ensures that the light emitted by the transmitting diode impinges on the receiving diode after total reflection off the wall or walls of the plastic or glass element. This is accomplished in that the material used for the element is of a nature that has a sufficiently high refractive index at the visible wavelengths employed vis-à-vis its surroundings, typically air, and that the element is shaped in a geometric configuration whereby, given the arrangement of the transmitting diode, receiving diode and plastic or glass element, the angle of incidence of the light emitted by the transmitting diode as it impinges on a surface of the element will exceed the critical angle of the total reflection, as measured against the perpendicular normal of the boundary surface. In other words, the material of the plastic or glass element that constitutes the light guide must have greater optical density than its surroundings and the center of the light beam emitted by the transmitting diode always impinges on the said boundary surface at as grazing an angle of incidence as possible.

Since according to the invention, the light guide is in the form of a solid plastic or glass element rather than a flexible fiber-optic device, the coupling of the light into the light guide is facilitated as well. Most significantly, there is no need for a complex alignment of a fiber-optic cable-type light guide with the transmitting diode. The same is true for the decoupling of the light from the light guide onto the receiving diode. This is because no focusing elements are needed for focusing the light onto the receiving diode. Yet according to a preferred embodiment of the invention, a focusing device is provided, serving to focus the light emitted by the transmitting diode onto the receiving diode. That focusing device is preferably molded right onto the light guide, for instance in the form of a lens directly integrated onto the plastic or glass element.

In a preferred embodiment of the invention, not only the transmitting diode and the receiving diode are mounted on one circuit board but the light guide as well is mounted on the same circuit board. The light guide is preferably positioned between the photodiodes that are surface-mounted on the board at a distance from each other, with the light guide possibly cemented to the board. In addition or as an alternative, the light guide may be force-fitted onto the circuit board, for instance by plugging rectangular- or square-profile feet of the light guide into circular holes in the circuit board. Additionally or alternatively, the feet of the light guide may be provided with detents or catches by means of which the feet can be locked in, i.e. snapped into, the holes in the circuit board.

The spectral range in which the transmitting diode and the receiving diode operate may, in essence, be arbitrarily selected for as long as the spectral wavelength of the transmitting diode and that of the receiving diode are matched and the light guide functions effectively in that particular wavelength range by displaying total reflection and being sufficiently transmissive. In a preferred implementation of the invention, however, the transmitting diode and the receiving diode operate in the infrared wavelength range, since that will largely eliminate interference by parasitic ambient light. In a preferred, enhanced embodiment of the invention, the exclusion of any such interference is further supported by equipping the receiving diode with a filter that screens out light in the visible wavelength range.

It follows that the optoelectronic coupler according to the invention can be produced by simple means, i.e. with conventional photodiodes, while the light guide on its part is easy to make, consisting for instance of a plastic element with a simple physical shape. These components can be mounted on a conventional circuit board, allowing the optoelectronic coupler of this invention to be produced in its entirety as part of the circuit board assembly and preferably in a surface-mounting process.

There are numerous ways in which the optoelectronic coupler according to this invention can be configured and further enhanced. These are reflected in the dependent patent claims and explained in the following description of a preferred embodiment of the invention with reference to the attached drawing.

BRIEF DESCRIPTION OF THE DRAWINGS

The drawing FIGURE shows an optoelectronic coupler according to a preferred embodiment of the invention, mounted on a circuit board.

DETAILED DESCRIPTION OF A PREFERED EMBODIMENT

The optoelectronic coupler illustrated in the drawing FIGURE, representing a preferred embodiment of the invention, encompasses two photodiodes 1, 2, these being a transmitting diode 1 and a receiving diode 2. Positioned between the transmitting diode 1 and the receiving diode 2 is a light guide 3 that serves to guide the light emitted by the transmitting diode 1 to the receiving diode 2. The light guide 3, being transmissive to the infrared light with which the photodiodes 1, 2 operate, is a synthetic plastic element consisting of polycarbonate, e.g. a PCV 2302 material.

As is evident from the drawing, the light guide 3 has a simple geometric i.e. physical shape, enabling it to be mounted on a circuit board 4 between the two photodiodes 1, 2 and, given the positioning of the transmitting diode 1 relative to the receiving diode 2, to guide the infrared light emitted by the transmitting diode 1 to the receiving diode 2. To that effect, two mutually opposite flanks of the light guide 3 cover the transmitting diode 1 and the receiving diode 2, which photodiodes are mounted on the circuit board 4 in such fashion that their transmitting and, respectively, receiving surfaces point upward away from the circuit board 4.

As indicated by the arrow that runs from the transmitting diode 1 to the receiving diode 2, the light emitted by the transmitting diode 1 impinges within the light guide 3, at an angle exceeding the critical angle of total reflection, on a boundary surface of the light guide 3 that extends at a sufficiently oblique angle relative to the beam direction of the transmitting diode 1. After another reflection within the light guide 3 off a boundary surface that again extends at a sufficiently oblique angle relative to the direction of propagation of the previously reflected light, the light then impinges on the receiving diode 2.

The boundary surfaces of the light guide 3 at which total reflection takes place may be rectilinear. However, in the preferred embodiment of the invention herein described, these boundary surfaces are curvilinear. The reason in this case is that, at least in the regions responsible for the total reflection, the light guide 3 is lens-shaped. The central section of the light guide 3 is not lens-shaped but planar for the simple reason that it allows for a lower, space-saving contour of the light guide 3 and thus of the optoelectronic coupler.

To ensure explosion protection as referred to above, the light guide 3 is so dimensioned that the transmitting diode 1 and the receiving diode 2 must be spaced apart on the circuit board 4 by at least 10 mm. As mentioned above and as shown in the FIGURE, the transmitting diode 1 and the receiving diode 2 are mounted on the circuit board 4 in such fashion that their light-emitting and, respectively, receiving surfaces point upward away from the circuit board 4. Positioning the photodiodes that way is a very simple process easily implemented as part of a surface-mounting operation. It also all but eliminates the need for an adjustment of the photodiodes 1, 2 after they have been mounted on the circuit board, meaning that the photodiodes 1, 2 can be mounted directly in the position in which they are ultimately used for the optoelectronic coupler.

Attaching the light guide 3 on the circuit board 4 is a very simple process as well, in that two feet 5 of the light guide 3 are plugged into corresponding perforations 6 in the circuit board 4. As the FIGURE shows, the light guide 3 is locked onto the circuit board 4 by means of detents provided on the feet 5, allowing these feet 5 to snap into a locking position in the perforations 6. In addition or as an alternative, it is possible to provide an adhesive bond with the circuit board 4 in the form of a cement layer 7.

What is claimed is:

1. An optoelectromc coupler, with two photodiodes and an optic light guide, with one of the two photodiodes serving as the transmitting diode and the other as the receiving diode and the light guide serving to guide the light emitted by the transmitting diode to the receiving diode by total reflection, wherein the transmitting diode and the receiving diode are mounted on a circuit board at a distance from each other and the light guide is a plastic or glass element that is mounted on the same circuit board, wherein the light guide is mounted on the circuit board between the transmitting diode and the receiving diode and at least partially covers the transmitting diode and the receiving diode, wherein the light-emitting surface of the transmitting diode and/or the light-receiving surface of the receiving diode point upward away from the circuit board, and wherein the boundary surfaces of the light guide which are responsible for the total reflection are curvilinear and the central section of the light guide between these surfaces is planar.

2. The optoelectronic coupler as in claim 1, wherein the light guide is of poly-carbonate.

3. The optoelectronic coupler as in claim 2, wherein the light guide is an injection molded article.

4. The optoelectronic coupler as in claim 1 or 2 wherein the transmitting diode and the receiving diode operate in the infrared spectrum range.

5. The optoelectronic coupler as in claim 4 wherein the receiving diode includes a filter that screens out light in the visible wavelength range.

6. An optoelectronic coupler, with two photodiodes and a optic light guide, with one of the two photodiodes serving as the transmitting diode and the other as the receiving diode and the light guide serving to guide the light emitted by the transmitting diode to the reciving diode, wherein the transmitting diode and the receiving diode are mounted on a circuit board at a distance from each other and the light guide is a plastic or glass element that is mounted on the same circuit board, wherein the light-emitting surface of the transmitting diode and/or the light-receiving surface of the receiving diode point up-ward away from the circuit board, and wherein the light guide is mounted on the circuit board between the transmitting diode and the receiving diode such that the light guide at least partially covers the transmitting diode and/or the receiving diode by providing two feet of the light guide which are plugged into corresponding perforations in the circuit board.

7. The optoelectronic coupler as in claim 6 wherein the feet of the light guide are provided with detents allowing the feet to snap into a locking position in the perforations in the circuit board.

8. The optoelectronic coupler as in claim 6 or 7 wherein at least part of the light guide is lens-shaped.

9. The optoelectronic coupler as in claim 6 or 7 wherein the light guide is of polycarbonate.

10. The optoelectronic coupler as in claim 9 wherein the light guide is an injection-molded article.

11. An optoelectronic coupler, with two photodiodes and an optic light guide, with one of the two photodiodes serving as the transmitting diode and the other as the receiving diode and the light guide serving to guide the light emitted by the transmitting diode to the receiving diode by total reflection, wherein the transmitting diode and the receiving diode are mounted on a circuit board at a distance from each other and the light guide is a plastic or glass element that is mounted on the same circuit board, wherein the light guide is mounted on the circuit board between the transmitting diode and the receiving diode and at least partially covers the transmitting diode and/or the receiving diode, wherein the light-emitting surface of the transmitting diode and/or the light-receiving surface of the receiving diode point upward away from the circuit board, wherein the regions of the light which are responsible for the total reflection are lens-shaped and the central section of the light guide between these regions is planar, and wherein the light guide comprises two feet which are plugged into corresponding perforations in the circuit board.

* * * * *